(12) United States Patent
Watatani

(10) Patent No.: US 7,656,921 B2
(45) Date of Patent: Feb. 2, 2010

(54) SEMICONDUCTOR LASER DEVICE AND METHOD FOR MANUFACTURING THE SAME SEMICONDUCTOR LASER DEVICE

(75) Inventor: Chikara Watatani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 935 days.

(21) Appl. No.: 11/397,680

(22) Filed: Apr. 5, 2006

(65) Prior Publication Data
US 2007/0091957 A1 Apr. 26, 2007

(30) Foreign Application Priority Data
Aug. 11, 2005 (JP) ............................. 2005-233045

(51) Int. Cl.
*H01S 5/00* (2006.01)
(52) U.S. Cl. ............ 372/46.01; 372/43.01; 372/44.011; 372/45.01
(58) Field of Classification Search ............. 372/45–47, 372/43.01, 44.011, 45.01, 46.01
See application file for complete search history.

(56) References Cited

U.S. PATENT DOCUMENTS

| 4,758,535 | A | * | 7/1988 | Sakakibara et al. ............ 438/43 |
| 5,383,215 | A | * | 1/1995 | Narui et al. ............... 372/46.01 |
| 5,390,205 | A | * | 2/1995 | Mori et al. ............... 372/46.01 |
| 5,596,592 | A | * | 1/1997 | Tanigami et al. .......... 372/46.01 |
| 5,822,349 | A | * | 10/1998 | Takaoka et al. ........... 372/46.01 |
| 6,084,901 | A | * | 7/2000 | Suzuki ......................... 372/96 |
| 6,333,946 | B1 | * | 12/2001 | Miyashita et al. ......... 372/46.01 |
| 6,470,038 | B2 | * | 10/2002 | Munakata et al. ......... 372/46.01 |
| 6,504,190 | B2 | | 1/2003 | Haematsu |
| 2002/0041613 | A1 | * | 4/2002 | Yoshida et al. ................. 372/46 |
| 2002/0118717 | A1 | * | 8/2002 | Nagashima et al. ........... 372/46 |
| 2003/0012240 | A1 | * | 1/2003 | Yamamoto et al. ............ 372/46 |
| 2003/0062517 | A1 | * | 4/2003 | Ryder et al. ................... 372/46 |

OTHER PUBLICATIONS

Tsuchiya, Tomonobu, et al.; In situ Deep Etching for an InGaAlAs Buried Heterostructure by Using HCl Gas in a Metalorganic Vapor Phase Epitaxy Reactor, *JP J. of Applied Physics*, vol. 43, No. 10A, (2004), pp. L1247-L1249.

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A current blocking structure of a semiconductor laser includes a p-type InP buried layer, an n-type InP current blocking layer, and a p-type InP current blocking layer laminated along the mesa side surface of a ridge. In the structure, an upper end part of the n-type InP current blocking layer is covered with the p-type InP buried layer and the p-type InP current blocking layer. The n-type InP current blocking layer is prevented from contacting n-type and p-type InP cladding layers. Creation of an ineffective current path from one of the n-type InP cladding layers through the n-type InP current blocking layer to a p-type InP cladding layer of the semiconductor laser is prevented.

9 Claims, 6 Drawing Sheets

SEMICONDUCTOR LASER DEVICE AND METHOD FOR MANUFACTURING THE SAME SEMICONDUCTOR LASER DEVICE

BACKGROUND OF THE INVENTION

1. Field of the Invention

The present invention relates to a semiconductor laser device and method for manufacturing the same, and more specifically to a buried semiconductor laser device and method for manufacturing the same.

2. Background Art

With the expansion of optical fiber communications network in recent years, demands for semiconductor laser devices that enable high-speed operation at high temperatures have been increasing. As a product to realize such demands, a semiconductor laser device using an AlGaInAs-based material for an active layer is attracting attention.

Since Al-containing semiconductor materials are easily oxidized, oxides of Al are easily formed in such semiconductor materials. If electric current is injected into the active layer of such a semiconductor laser, the defects formed by the oxides of Al create non radiative recombination centers to deteriorate the device. Therefore, a semiconductor laser wherein an AlGaInAs-based material is applied in a multiple quantum well (MQW) active layer has been fabricated using a structure and method for preventing the oxidation of AlGaInAs.

In Non-Patent Document "Japanese Journal of Applied Physics, Vol. 43, No. 10A, pp. L1247-L1249", a method for manufacturing a semiconductor laser that prevents the oxidation of AlGaInAs is disclosed. The manufacturing method will be described below.

First, an n-type InP clad layer, a lower light confinement layer, an MQW active layer, an upper light confinement layer, and a p-type InP clad layer are sequentially laminated on an n-type InP substrate in the order from the bottom. These layers are formed by a metal organic vapor phase epitaxy (MOVPE) method or the like. The lower light confinement layer, the MQW active layer, and the upper light confinement layer are formed using an AlGaInAs-based material.

Next, a mask pattern is formed on the p-type InP clad layer, and is used as a mask to etch the p-type InP clad layer, the upper light confinement layer, the MQW active layer, the lower light confinement layer, and the n-type InP clad layer. As a result, forward tapered mesa side surfaces are formed on both sides of the mask pattern. Then, a buried layer is formed along the mesa side surfaces. Next, the mask pattern is removed to form a p-type InP clad layer on the entire surface.

In the above-described manufacturing method, the etching step to form the mesa side surfaces is carried out using HCl gas in a reactor of metal organic chemical vapor deposition (MOCVD) equipment. Furthermore, in the same reactor, a buried layer is formed. Specifically, in the same reactor of the same equipment, the formation of mesa side surfaces and the formation of a buried layer can be sequentially performed.

By thus forming the layers, the oxidation of AlGaInAs exposed on the mesa side surfaces can be prevented.

SUMMARY OF THE INVENTION

The structure of a semiconductor laser wherein a buried layer is formed by inversing n-type and p-type conductivity types and laminating p-type, n-type, and p-type InP layers on the mesa side surface in the order from the bottom in the above-described manufacturing method is shown in FIG. 11.

The buried layer is formed by laminating a p-type InP buried layer 9, an n-type InP current blocking layer 10, and a p-type InP current blocking layer 11 along the mesa side surface 8a and the mesa bottom surface 8b in the order from the bottom.

A (111) B surface is exposed on the mesa side surface 8a, and has a predetermined angle to the major surface of the p-type InP substrate 1. Therefore, the end part of the n-type InP current blocking layer 10 is exposed on the surface of the buried layer, and contacts the n-type InP clad layer 12. As a result, an ineffective current path 23 is created from the n-type InP clad layer 12 through the n-type InP current blocking layer 10 to the p-type InP clad layer 2. Thereby, the current injection efficiency to the MQW active layer 4 when applying current is lowered.

In order to solve the above-described problems, it is an object of the present invention to provide a semiconductor laser device and a method for manufacturing the same using an AlGaInAs-based material wherein the deterioration of the device due to the oxidation of an active layer on a mesa side surface is prevented, and the lowering of current injection efficiency by an ineffective current path that does not pass through a active layer is suppressed.

The above object is achieved by a semiconductor laser device comprising a substrate of a first conductivity type, a ridge part formed on said substrate, whose side surface has a sequentially tapered shape having a predetermined angle to the major surface of said substrate, wherein a semiconductor layer of a first conductivity type, an active layer that generates laser beams, and a second semiconductor layer of a second conductivity type are sequentially laminated in the order from the bottom, a current blocking structure wherein a third semiconductor layer of a first conductivity type, a fourth semiconductor layer of a second conductivity type, and a fifth semiconductor layer of a first conductivity type are sequentially laminated in the order from the bottom so as to bury both sides of said ridge part, wherein the end part of said fourth semiconductor layer is covered with said third semiconductor layer and said fifth semiconductor layer, and a sixth semiconductor layer of a second conductivity type that covers the upper surface of said ridge part and the upper surface of said current blocking structure.

The above object is achieved by a method for manufacturing a semiconductor laser device comprising a first step for processing a laminated film formed by laminating a first semiconductor layer of a first conductivity type, an active layer that generates laser beams, and a second semiconductor layer of a second conductivity type on a substrate of a first conductivity type in the order from the bottom, to form a ridge part whose side surface has a sequentially tapered shape having a predetermined angle to the major surface of said substrate, wherein said active layer is exposed on said side surface, a second step for forming a third semiconductor layer of a first conductivity type on both sides of said ridge part so as to cover the exposed part of said active layer, a step for forming a fourth semiconductor layer of a second conductivity type on both sides of said ridge part so as to cover said third semiconductor layer, a step for removing the upper end part of said fourth semiconductor layer to expose the end part of said third semiconductor layer, a step for forming a fifth semiconductor layer of a first conductivity type on both sides of said ridge part so as to cover the end part of said third semiconductor layer and said fourth semiconductor layer, and a step for forming a sixth semiconductor layer of a second conductivity type so as to cover said second semiconductor layer and said fifth semiconductor layer.

According to the present invention, in a semiconductor laser device using an AlGaInAs-based material and a method for manufacturing such a semiconductor laser device, the deterioration of the device due to the oxidation of an active layer on a mesa side surface can be prevented. The lowering of current injection efficiency by an ineffective current path that does not pass through an active layer can also be suppressed.

BEST MODE FOR CARRYING OUT THE INVENTION

Figure 1:
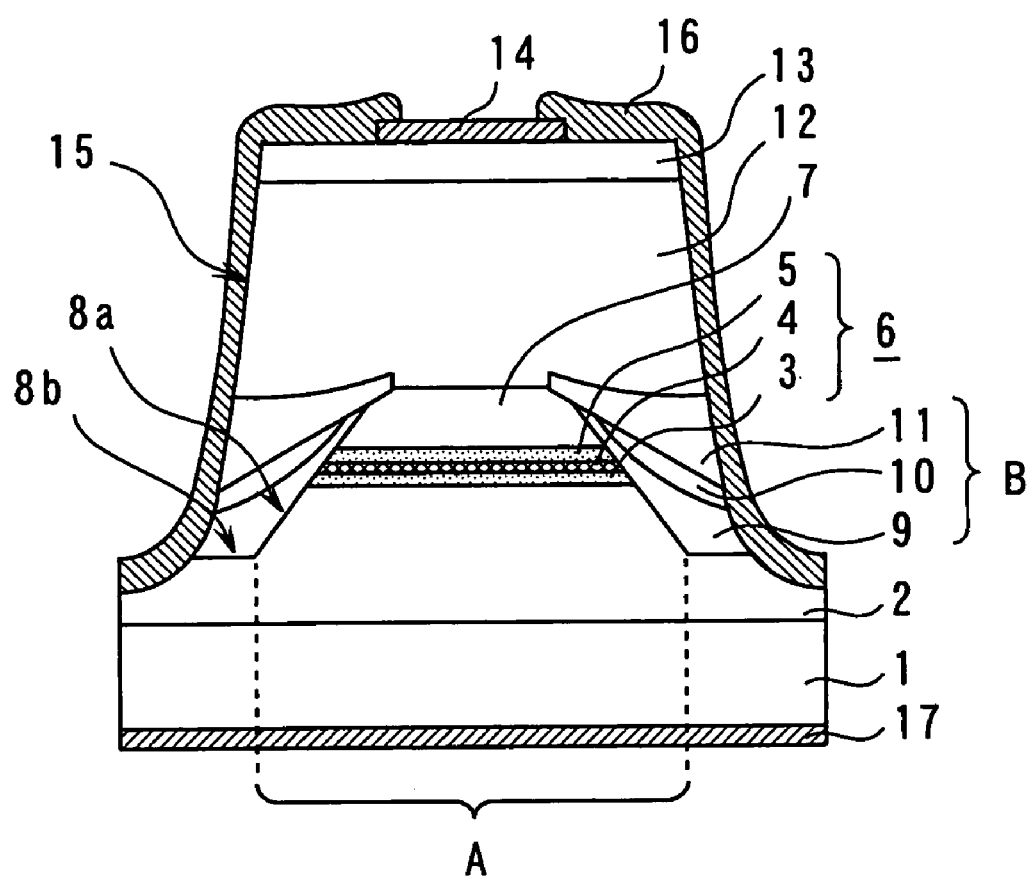
FIG. 1 shows a structure of a semiconductor laser device of the embodiment.

An embodiment of the present invention will be described below referring to the drawings. In the drawings, the same or equivalent parts will be denoted by the same symbols, and the description thereof will be simplified or omitted.

EMBODIMENT

The structure of a semiconductor laser device according to this embodiment is shown in FIG. 1. The semiconductor laser device is formed on a p-type InP substrate 1. A p-type InP clad layer 2 is formed thereon. On the p-type InP clad layer 2, a lower light confinement layer 3, a multiple quantum well (hereafter abbreviated as "MQW") active layer 4, and an upper light confinement layer 5 are laminated in the order from the bottom (hereafter, the structure formed by laminating these layers is referred to as a "laminated structure 6"). By injecting electrons and holes into the MQW active layer 4, laser beams can be generated. An n-type InP clad layer 7 is formed on the laminated structure 6.

A ridge part A is formed of the p-type InP clad layer 2, the laminated structure 6, and the n-type InP clad layer 7. A (111) B surface is exposed on the side surface of the ridge part A. The ridge part A has a sequentially tapered mesa shape wherein the side thereof has a predetermined angle (about 54.7°) to the major surface of the p-type InP substrate 1. The p-type InP clad layer 2 extends horizontally from the lower edge part of the side surface of the ridge part A on both outsides. (Hereafter, the side surface of the ridge part A is referred to as "mesa side surface 8a"; and the surface extending horizontally from the lower edge part of the mesa side surface 8a on both sides is referred to as "mesa bottom surface 8b".)

A p-type InP buried layer 9, an n-type InP current blocking layer 10, and a p-type InP current blocking layer 11 along the mesa side surface 8a and the mesa bottom surface 8b are stacked in order, so as to bury both sides of the ridge part A (hereafter, the structure formed by laminating these layers is referred to as a "current blocking structure B"). The end part of the n-type InP current blocking layer 10 is covered with the p-type InP buried layer 9 and the p-type InP current blocking layer 11.

An n-type InP clad layer 12 is formed so as to cover the upper surface of the ridge part A and the upper surface of the current blocking structure B. An n-type InGaAs contact layer 13 is formed thereon; and an n-type electrode 14 is formed on the n-type InGaAs contact layer 13.

An isolation trench 15 is formed so as to isolate the laminated films from the p-type InP clad layer 2 to the n-type InGaAs contact layer 13 at the location outside the ridge part A. An insulation film 16 is formed so as to cover the inner surface of the isolation trench 15, the end part of the upper surface of the n-type InGaAs contact layer 13, and the end part of the n-type electrode 14. A p-type back electrode 17 is formed on the back surface of the p-type InP substrate 1.

When applying current to the above-described semiconductor laser device, holes are injected into the MQW active layer 4 from the p-type InP clad layer 2 side; and electrons are injected into the MQW active layer 4 from the n-type InP clad layer 7 side. By combining these holes and electrons, laser beams can be generated in the MQW active layer 4.

As described above, the end part of the n-type InP current blocking layer 10 is covered with the p-type InP buried layer 9 and the p-type InP current blocking layer 11. Therefore, the n-type InP current blocking layer 10 has a structure that contacts neither the n-type InP clad layer 7 nor the n-type InP clad layer 12.

Thereby, no ineffective current path is created from the n-type InP clad layer 12 through the n-type InP current blocking layer 10 to the p-type InP clad layer 2. Therefore, the creation of the ineffective current path that does not pass through the MQW active layer 4 can be prevented, and the lowering of current injection efficiency into the MQW active layer 4 can be suppressed.

Next, a method for manufacturing a semiconductor laser device according to this embodiment will be described referring to cross-sectional views shown in FIGS. 2 to 10.

Figure 2:
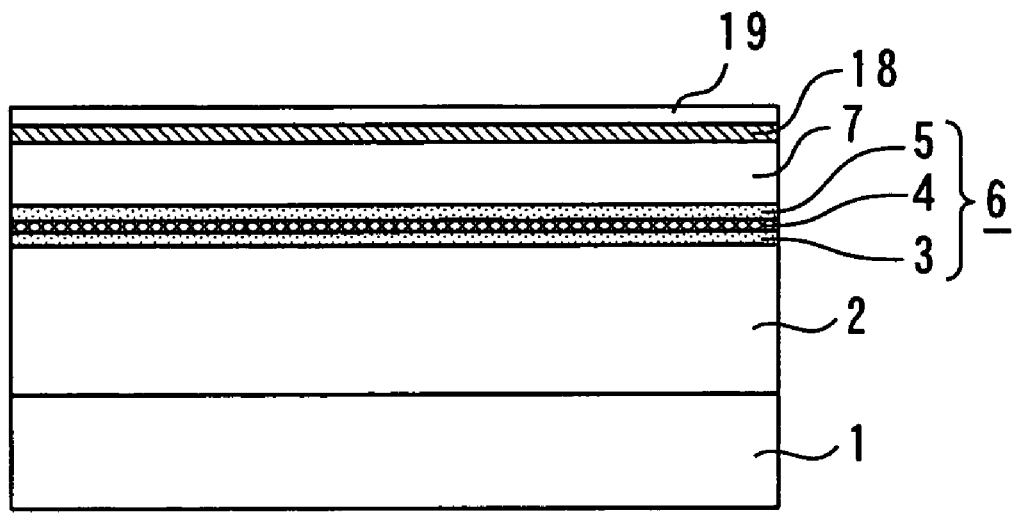
FIGS. 2-10 show a method for manufacturing a semiconductor laser device of the embodiment.

The semiconductor laser device is formed on the major surface of a p-type InP substrate (wafer). First, as FIG. 2 shows, a p-type InP clad layer 2 is formed on a p-type InP substrate 1. Next, a laminated structure 6 wherein a lower light confinement layer 3, an MQW active layer 4, and an upper light confinement layer 5 are sequentially laminated is formed on the p-type InP clad layer 2. The laminated structure is composed of an AlGaInAs-based material. The MQW active layer 4 is used to generate laser beams. Next, an n-type InP clad layer 7, an n-type InGaAs cap layer 18 and an n-type InP cap layer 19 are formed on the laminated structure 6.

From the step for forming the p-type InP clad layer 2 to the step for forming the n-type InP cap layer 19, the layers are formed using a metal organic vapor phase epitaxy (hereafter abbreviated as "MOVPE") method or the like.

Next, the n-type InP cap layer 19 shown in FIG. 2 is etched off.

Figure 3:
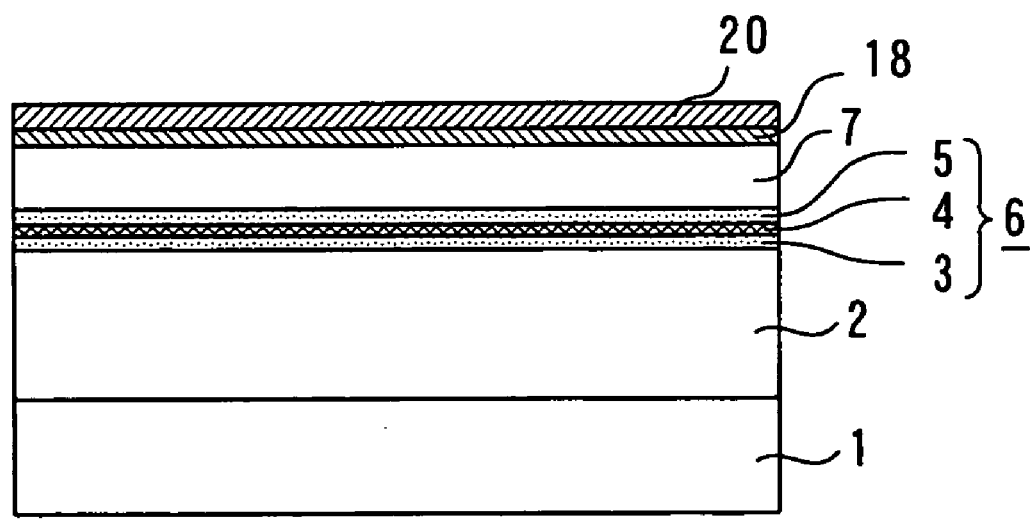
Figure 4:
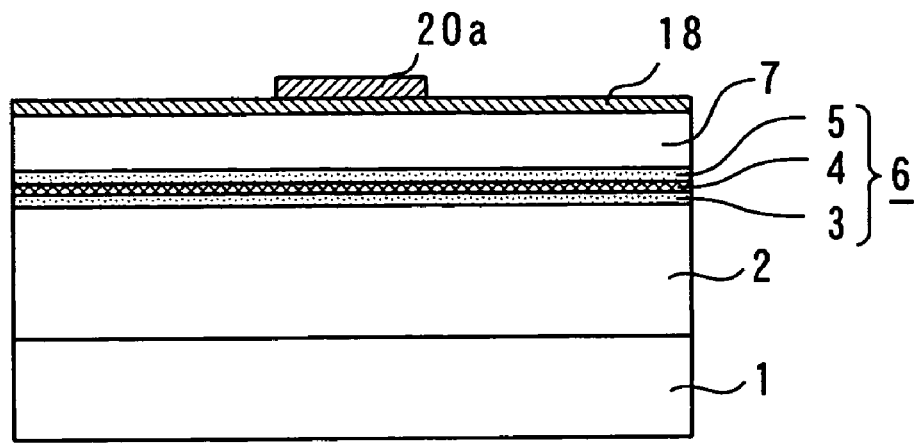

Then, as FIG. 3 shows, a silicon oxide film 20 is formed on the n-type InGaAs cap layer 18. Next, a resist pattern (not shown) is formed on the silicon oxide film 20 using photo lithography. Then, the resist pattern is used as a mask to selectively etch the silicon oxide film 20. As a result, a mask pattern 20a is formed on the n-type InGaAs cap layer 18.

Figure 5:
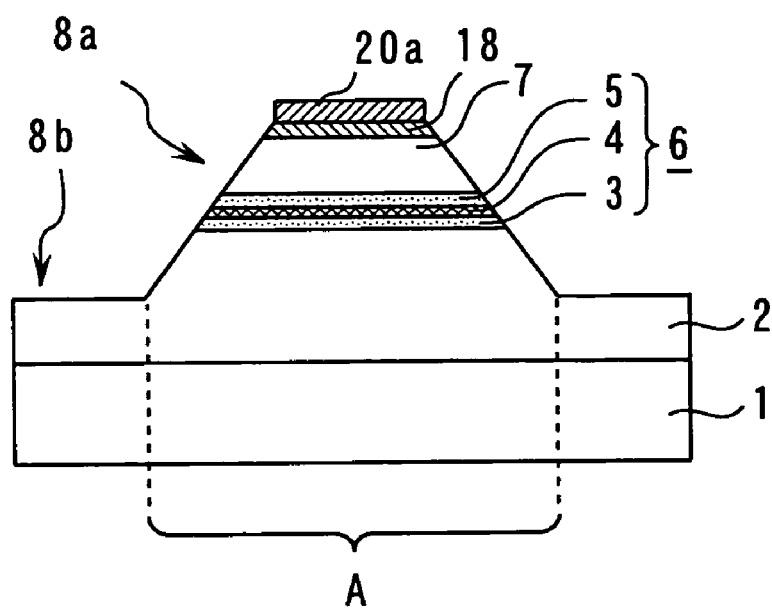

Next, using the mask pattern 20a as a mask, the n-type InGaAs cap layer 18, the n-type InP clad layer 7, the laminated structure 6, and the p-type InP clad layer 2 are selectively etched. This etching is performed in a reactor of the MOVPE equipment using an HCl-added gas. As a result, a mesa side surface 8a having a sequentially tapered shape is formed from the lower end parts of both sides of the mask pattern 20a obliquely downward as FIG. 5 shows. The mesa side surface 8a is composed of a (111) B surface, and the MQW active layer 4 is exposed on this surface. At the same time, a mesa bottom surface 8b extending from the lower end part of the mesa side surface 8a in the horizontal directions is formed. As a result, a ridge part A composed of the upper surface of the n-type InP clad layer 7 and the mesa side surface 8a is formed. The ridge part A has a sequentially tapered shape having a predetermined angle (about 54.7°) to the major surface of the p-type InP substrate 1.

Figure 6:
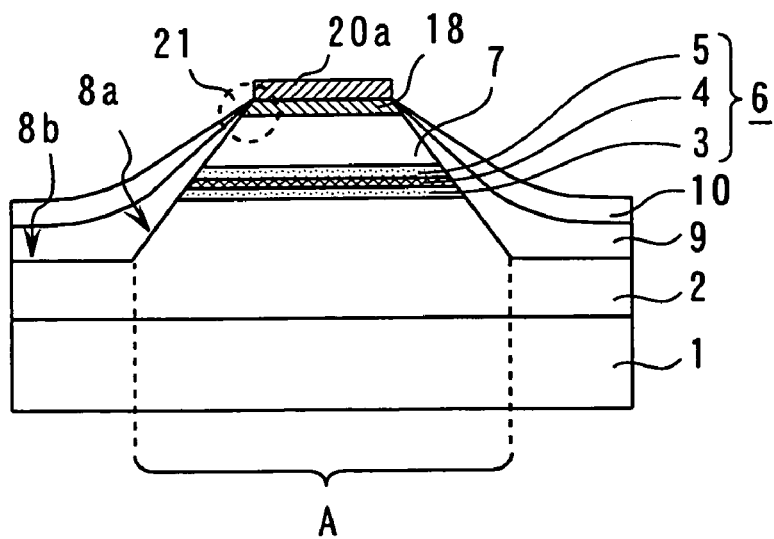

Next, as FIG. 6 shows, a p-type InP buried layer 9 is formed on both sides of the ridge part A along the mesa side surface 8a and the mesa bottom surface 8b. At this time, the part exposed on the mesa side surface 8a of the MQW active layer 4 is covered with the p-type InP buried layer 9. This step is continuously carried out after the step for forming the mesa side surface 8a and the mesa bottom surface 8b without taking the p-type InP substrate 1 (wafer) out of the MOVPE equipment.

By thus forming the layers, the oxidation of the side of the laminated structure 6 exposed on the mesa side surface 8a can be prevented. In other words, the oxidation of AlGaInAs exposed on the mesa side surface 8a can be prevented.

Furthermore, in the MOVPE equipment, n-type InP current blocking layers 10 are formed on both sides of the ridge part A so as to cover the p-type InP buried layer 9. As described above, a (111) B surface is exposed on the mesa side surface 8a, a (111) B surface has a predetermined angle to the major surface of the p-type InP substrate 1. Therefore, the end parts of the n-type InP current blocking layers 10 are grown to the vicinity of the upper end parts 21 (the parts surrounded by dotted lines) of the mesa side surface 8a.

Figure 7:
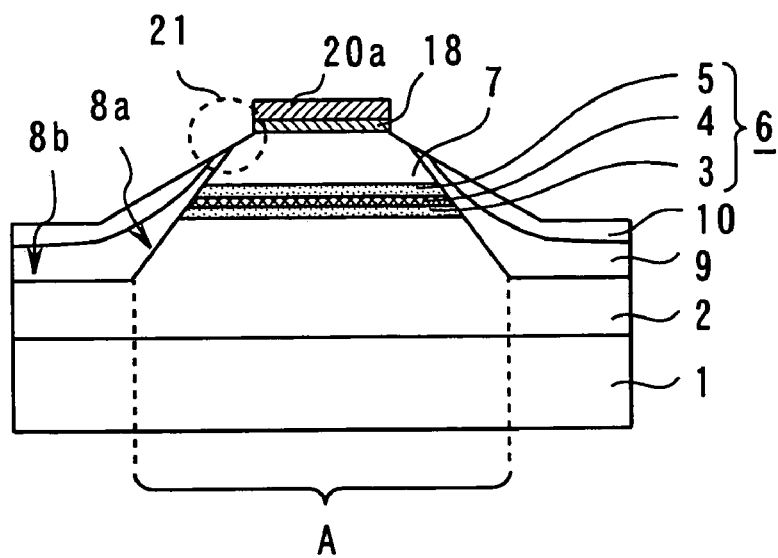

Next, a part of the upper end parts 21 of the n-type InP current blocking layers 10 is selectively etched off using dry-etching equipment. As a result, as FIG. 7 shows, the end part of the p-type InP buried layer 9 is exposed on the upper end parts 21 of the mesa side surface 8a.

Figure 8:
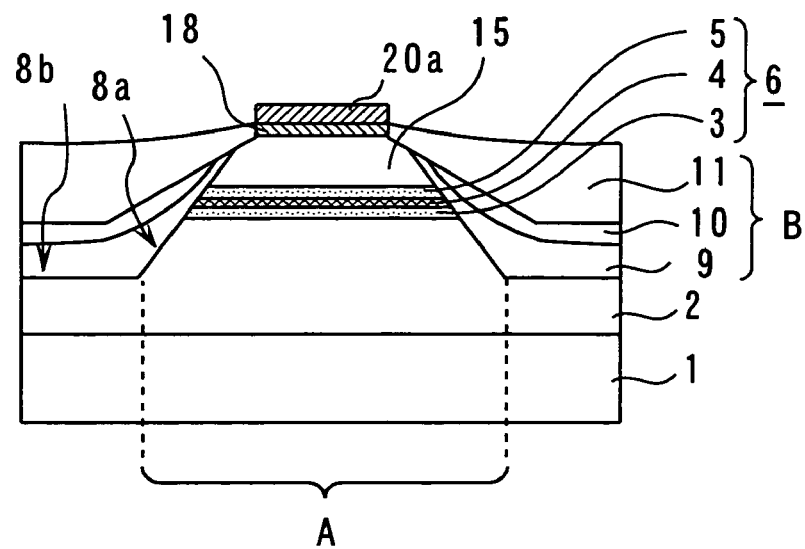

Next, p-type InP current blocking layers 11 are formed on both sides of the ridge part A so as to cover the end part of the p-type InP buried layer 9, and the n-type InP current blocking layers 10. These layers are formed using MOVPE equipment. As a result, as FIG. 8 shows, a structure wherein the end part of the n-type InP current blocking layers 10 is covered with the p-type InP buried layer 9 and the p-type InP current blocking layers 11 can be obtained.

Next, although not shown in the drawings, the mask pattern 20a and the n-type InGaAs cap layer 18 are removed.

Figure 9:
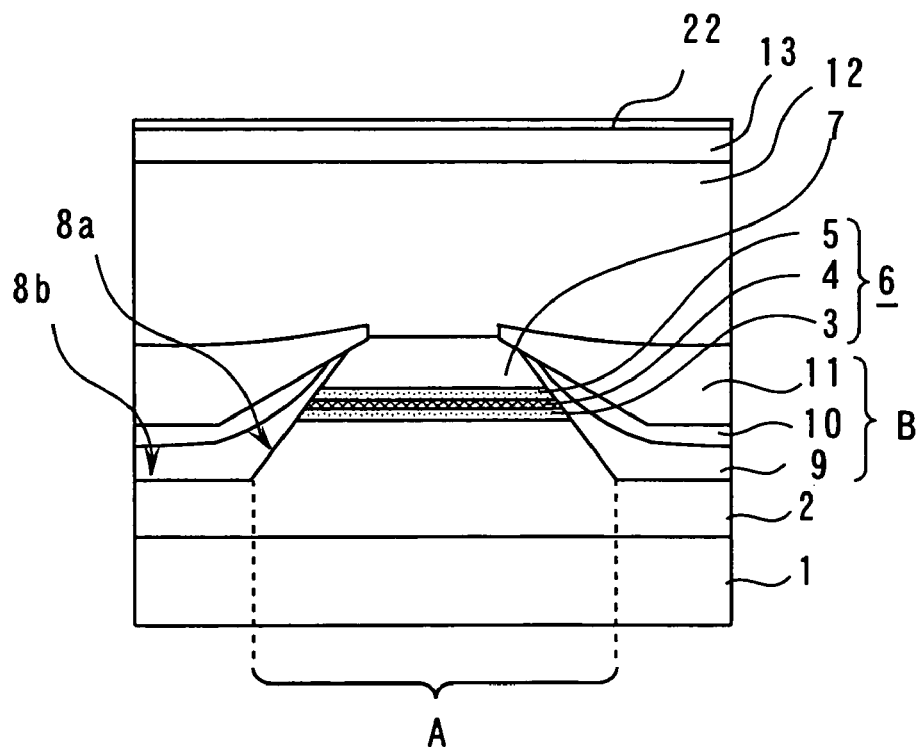

Next, as FIG. 9 shows, an n-type InP clad layer 12 is formed on the entire surface so as to cover the n-type InP clad layer 7 and the p-type InP current blocking layers 11. Furthermore, an n-type InGaAs contact layer 13 and an n-type InP cap layer 22 are sequentially laminated thereon. These layers are formed using MOVPE equipment. Next, although not shown in the drawings, the n-type InP cap layer 22 is removed.

Figure 10:
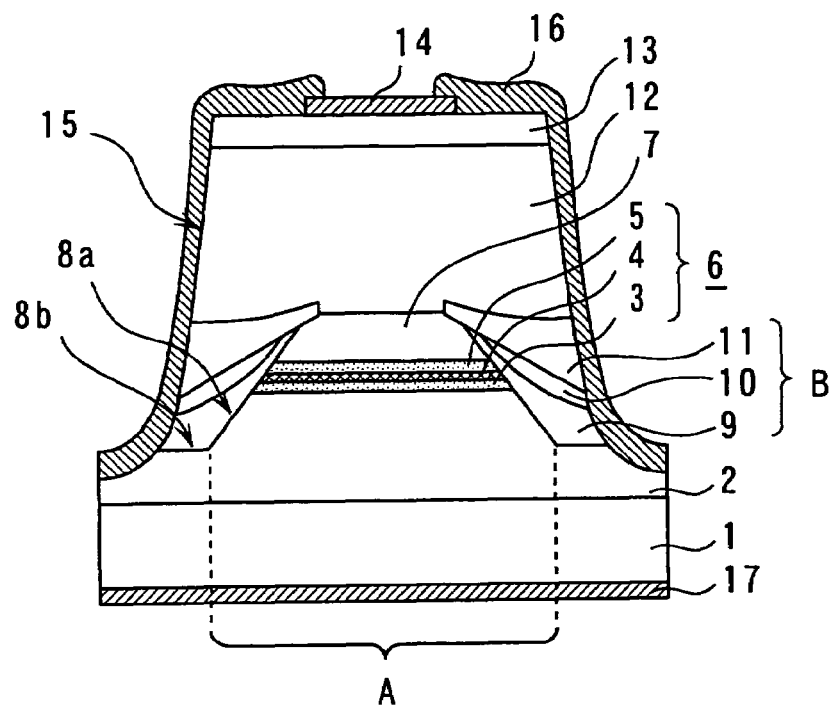
Figure 11:
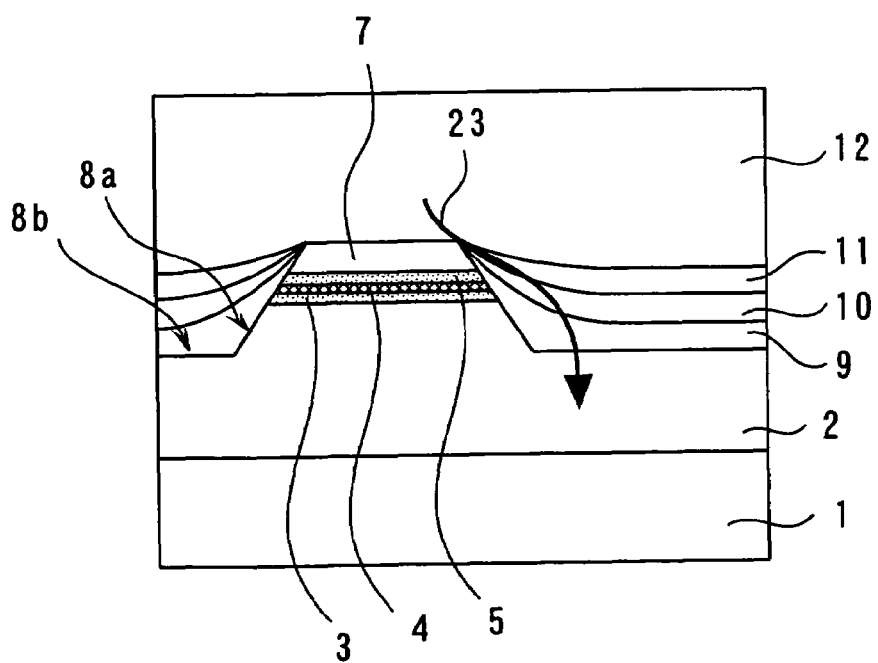
FIG. 11 shows an ineffective current path of a semiconductor laser device.

Next, as FIG. 10 shows, photo lithography, etching and the like are performed to form an isolation trench 15 so as to isolate the laminated films from the p-type InP clad layer 2 to the n-type InGaAs contact layer 13 at the location outside the ridge part A. Next, an n-type electrode 14 is formed on the n-type InGaAs contact layer 13. Then, an insulation film 16 is formed so as to cover the inner surface of the isolation trench 15, the upper end part of the n-type InGaAs contact layer 13, and the end part of the n-type electrode 14. Furthermore, the back surface of the p-type InP substrate 1 is polished to form a p-type back electrode 17 on the back surface of the p-type InP substrate 1.

By the above-described method for manufacturing a semiconductor laser device, the semiconductor laser device shown in FIG. 1 can be formed. According to this manufacturing method, the oxidation of AlGaInAs exposed on the mesa side surface 8a can be prevented. Thereby, the deterioration of a semiconductor laser device caused by oxides can be suppressed. In this embodiment, a semiconductor laser device having a material containing aluminum (Al), which is easily oxidized in an MQW active layer 4, and a manufacturing method thereof have been described. However, an equivalent effect can be obtained even from other materials as long as an oxide can be formed from such materials.

In addition, a semiconductor laser device can also be formed wherein the creation of an ineffective current path that does not pass through the MQW active layer 4 can be prevented.

In the above-described embodiment, an example wherein a (111) B surface is exposed on the mesa side surface 8a, and has a predetermined angle (about 54.7°) to the mesa bottom surface 8b has been described. When the angle of the mesa side surface 8a to the mesa bottom surface 8b is smaller than the above-described predetermined angle, the n-type InP current blocking layers 10 grow along the mesa side surface 8a. When the angle is larger than the above-described predetermined angle, the n-type InP current blocking layers 10 grow while forming a (111) B surface along the mesa side surface 8a and a (001) surface. Even when the angle of the mesa side surface 8a to the mesa bottom surface 8b is 90°, the n-type InP current blocking layers 10 also grow while forming a (111) B surface. Therefore, in any of the above-described cases, there is possibility of causing the connection of the n-type InP clad layer 12 and the n-type InP current blocking layers 10 at the top of the mesa side surface 8a, which is an object of the present invention.

Therefore, in the present invention, the angle of the mesa side surface 8a to the mesa bottom surface 8b is not limited to the above-described predetermined angle (about 54.7°). In other words, the same effect is obtained if the mesa side surface 8a has a sequentially tapered shape or a vertical shape before forming the current blocking structure B.

In the semiconductor laser device and the manufacturing method thereof described in this embodiment, an example using a p-type semiconductor substrate has been shown. However, the equivalent effect can be obtained even when an n-type semiconductor substrate is used and all the polarities of n- and p-types are inversed.

The invention claimed is:

1. A semiconductor laser element comprising;
   a substrate of a first conductivity type and having a planar major surface;
   a ridge part including a first semiconductor layer of a first conductivity type, an active layer that generates a laser beam, and a second semiconductor layer of a second conductivity type, sequentially laminated in this order and disposed on the major surface of said substrate, said ridge part having side surfaces in (111) crystalline planes of said first and second semiconductor layers and said active layer, said side surfaces forming a predetermined angle with the major surface of said substrate;
   a current blocking structure including a third semiconductor layer of the first conductivity type, a fourth semiconductor layer of the second conductivity type, and a fifth semiconductor layer of the first conductivity type, sequentially laminated, in this order, and burying both side surfaces of said ridge part, said fourth semiconductor layer being enveloped by said third semiconductor layer and said fifth semiconductor layer so that said fourth semiconductor layer does not contact either side surface of said ridge part; and
   a sixth semiconductor layer of the second conductivity type covering an upper surface of said ridge part and an upper surface of said current blocking structure.

2. The semiconductor laser element according to claim 1, wherein said fifth semiconductor layer contacts said third semiconductor layer.

3. The semiconductor laser element according to claim 1, wherein
said fourth semiconductor layer is closer to said substrate than is the upper surface of said ridge part, and
both of said third and fifth semiconductor layers contact said side surfaces of said ridge part.

4. The semiconductor laser element according to claim 1, wherein aluminum is included in said active layer.

5. A method of manufacturing a semiconductor laser element comprising:
processing a laminated film that has been formed by laminating a first semiconductor layer of a first conductivity type, an active layer that generates a laser beam, and a second semiconductor layer of a second conductivity type on a substrate of the first conductivity type, in that order, to form a ridge part having side surfaces and a sequentially tapered shape, said surfaces forming a predetermined angle with a major surface of said substrate, wherein said active layer is exposed on said side surfaces;
forming a third semiconductor layer of the first conductivity type on both sides of said ridge part, covering exposed parts of said active layer;
forming a fourth semiconductor layer of the second conductivity type on both sides of said ridge part, covering said third semiconductor layer;
removing an upper end part of said fourth semiconductor layer to expose an end part of said third semiconductor layer;
forming a fifth semiconductor layer of the first conductivity type on both sides of said ridge part, contacting the end part of said third semiconductor layer and covering said fourth semiconductor layer; and
forming a sixth semiconductor layer of the second conductivity type covering said second semiconductor layer and said fifth semiconductor layer.

6. The method of manufacturing a semiconductor laser element according to claim 5, including:
exposing said end part of said third semiconductor layer between an upper end part of said fourth semiconductor layer and said ridge part in removing said upper end part of said fourth semiconductor layer,
forming said fifth semiconductor layer to connect said exposed end part of said third semiconductor layer to said fifth semiconductor layer.

7. The method of manufacturing a semiconductor laser element according to claim 5, wherein aluminum is included in said active layer.

8. The method of manufacturing a semiconductor laser element according to claim 5, wherein processing said laminated film and forming said third semiconductor layer are sequentially carried out in the same equipment.

9. The method of manufacturing a semiconductor laser element according to claim 5, including removing said upper end of said fourth semiconductor layer by dry-etching.

* * * * *